(12) United States Patent
Chidambarrao et al.

(10) Patent No.: US 7,449,378 B2
(45) Date of Patent: Nov. 11, 2008

(54) STRUCTURE AND METHOD FOR IMPROVED STRESS AND YIELD IN PFETS WITH EMBEDDED SIGE SOURCE/DRAIN REGIONS

(75) Inventors: Dureseti Chidambarrao, Weston, CT (US); Brian J. Greene, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/034,296

(22) Filed: Feb. 20, 2008

(65) Prior Publication Data

US 2008/0145986 A1 Jun. 19, 2008

Related U.S. Application Data

(62) Division of application No. 11/161,066, filed on Jul. 21, 2005, now Pat. No. 7,358,551.

(51) Int. Cl.
*H01L 21/336* (2006.01)
(52) U.S. Cl. .................. 438/197; 438/221; 438/296
(58) Field of Classification Search ............... 438/197, 438/199, 219, 221, 294, 296, 424, 435
See application file for complete search history.

(56) References Cited

U.S. PATENT DOCUMENTS

| 6,828,209 | B1 | 12/2004 | Maruo |
| 2004/0113174 | A1 | 6/2004 | Chidambarrao et al. |
| 2005/0156274 | A1 | 7/2005 | Yeo et al. |
| 2005/0247926 | A1 | 11/2005 | Sun et al. |
| 2006/0121688 | A1* | 6/2006 | Ko et al. ............. 438/439 |
| 2006/0202301 | A1* | 9/2006 | Ohta et al. ............. 257/510 |

* cited by examiner

*Primary Examiner*—Tuan H Nguyen
(74) *Attorney, Agent, or Firm*—Scully, Scott, Murphy & Presser, P.C.; H. Daniel Schnurmann

(57) ABSTRACT

The present invention provides a technique for forming a CMOS structure including at least one pFET that has a stressed channel which avoids the problems mentioned in the prior art. Specifically, the present invention provides a method for avoiding formation of deep canyons at the interface between the active area and the trench isolation region, without requiring a trench isolation pulldown, thereby eliminating the problems of silicide to source/drain shorts and contact issues. At the same time, the method of the present invention provides a structure that allows for a facet to form at the spacer edge, retaining the Miller capacitance benefit that such a structure provides. The inventive structure also results in higher uniaxial stress in the MOSFET channel compared to one which allows for a facet to grow at the trench isolation edge.

9 Claims, 4 Drawing Sheets

STRUCTURE AND METHOD FOR IMPROVED STRESS AND YIELD IN PFETS WITH EMBEDDED SIGE SOURCE/DRAIN REGIONS

RELATED APPLICATION

This application is a divisional of U.S. patent application Ser. No. 11/161,066, filed Jul. 21, 2005 now U.S. Pat. No. 7,358,551.

DESCRIPTION

1. Field of the Invention

The present invention relates to a strained semiconductor structure and a method of forming the same. More particularly, the present invention relates to a strained complementary metal oxide semiconductor (CMOS) structure in which the stress in the channel region is enhanced. The present invention also provides a method of fabricating the CMOS structure of the present invention in which the process yield is improved compared to prior art techniques.

2. Background of the Invention

In present semiconductor technology, CMOS devices, such as nFETs or pFETs, are typically fabricated upon semiconductor wafers, such as Si, that have a single crystal orientation. In particular, most of today's semiconductor devices are built upon Si having a (100) crystal orientation.

Stress can be introduced into a single crystal oriented substrate by several methods including, for example, forming a stress inducing liner on top of the substrate and around the gate region. Although stress inducing liners can be used as a means to enhance carrier mobility, further improvement is still required.

Uniaxial compressive stress can be obtained by embedding silicon germanium (SiGe) alloys in the source and drain regions of the MOSFETs, particularly pFETs. Typically, this is done by masking a polysilicon layer and performing a Si etch on the source and drain regions, followed by SiGe epitaxy. In order to ensure that the stress from the SiGe is maximized at the channel surface, a raised source/drain configuration is typically used. The raised source/drain configuration also minimizes the impact of stress relaxation in the silicided regions.

The additional Miller capacitance associated with raised source/drain regions is mitigated somewhat by the tendency of the SiGe epitaxy to form a [111] facet at the spacer edge once the vertical growth front extends beyond the original silicon surface. The term "facet" is used in the present invention to denote a change in the crystallographic orientation of the growth front during epitaxy. FIG. 1 illustrates this change in crystallographic orientation in greater detail for the case in which a SiGe epitaxy is formed providing a [100] growth plane and a [111] growth plane. This same tendency occurs on shallow trench isolation (STI) sidewalls as well, creating deep canyons which can cause significant impediments to the successful integration of embedded SiGe devices to an existing device flow. Some issues that need to be addressed in prior art embedded SiGe devices include the potential silicide shorting of the source/drain to the body in bulk semiconductors, a difficulty in contacting the device due to inadequate clearing of the middle-of-the-line (MOL) dielectric and the contact etch stop liner in the canyon (which are critical for both bulk and semiconductor-on-insulator (SOI) technologies). Further, faceted growth at the STI sidewall results in a reduction of stress in the channel, which is particularly problematic in devices with relatively small gate to STI distance.

It appears that others in the industry have avoided the deep canyon formation at the interface between the active area and the STI by recessing the STI. In doing so, the issue of contacting the device is alleviated, but the risk of silicide shorts between the source/drain and the body remain, and due to the STI pulldown, both the nFET and the pFET become vulnerable to this problem.

The problems mentioned above will now be described in reference to FIGS. 2 and 3. Specifically, FIG. 2 is a pictorial representation of a prior art pMOSFET which has been prepared using a standard CMOS fabrication process employing an n-type silicon channel region 12 located in substrate 10, which is isolated from neighboring devices by a shallow trench isolation 14 which consists of an insulating dielectric material. A gate dielectric 18 and electrode 20 are fabricated to define the device channel 12. Oxide 24 and nitride 26 sidewall spacers are employed to offset the pFET extension and source drain regions 17 from the device channel 12 in a self-aligned fashion. In order to induce stress in the channel 12, a recess etch is performed in the source and drain regions 16. The resulting cavity is then filled via epitaxial growth of a second material, suitably chosen to induce stress in the device channel 12, such as a silicon germanium alloy 28.

The silicon germanium epitaxy is intentionally formed in a raised source/drain configuration to minimize the impact of the silicide stress (tensile in the case of commonly used materials, CoSi, and NiSi) on the channel 12. The subsequent increase in Miller capacitance due to the raised source and drain is mitigated by the natural facet formation at the spacer boundary 30 during epitaxial growth. Similarly, a facet 32 is formed at the shallow trench isolation sidewall, however, because this facet extends below the gate dielectric 18, its effect is to reduce the amount of stress obtained in the device channel 12.

FIG. 3 is a pictorial representation of a prior art MOSFET structure in which the shallow trench isolation dielectric is dramatically recessed. By recessing the STI, one can avoid the formation of spacers on the STI sidewall during subsequent processing as would likely result in the case of the structure shown in FIG. 2. The existence of spacers on the STI sidewalls would result in incomplete silicidation of the source and drain and is expected to negatively impact manufacturing yield. Even if one can prevent spacer formation on the STI sidewall, another yield concern arises from the fact that the silicide 34 formed at the STI 14 edge is in close proximity to the junction edge 13, placing stringent requirements on the control needed on the STI pulldown etch, in order to avoid shorting the source or drain to the body of the device.

Another means of improving the carrier mobility is by utilizing a hybrid oriented substrate having planar surfaces of different crystal orientation. These types of substrates have recently been developed. See, for example, U.S. patent application Ser. No. 10/250,241, filed Jun. 23, 2003 and U.S. patent application Ser. No. 10/696,634, filed Oct. 29, 2003. Additionally, hybrid-orientated metal oxide semiconductor field effect transistors (MOSFETs) have recently demonstrated significantly higher circuit performance at the 90 nm technology node. Although hybrid oriented substrates having planar surfaces of different crystal orientation can increase the carrier mobility, further improvement is needed in order to keep the performance scaling as devices are being scaled.

In view of the above, there is a need for providing embedded stress-inducing devices in which deep canyon formation at the interface between the active area and the trench isolation is avoided, without requiring trench isolation pulldown, thereby eliminating the concern of the silicide source/drain to body shorts and contact issues.

SUMMARY OF THE INVENTION

The present invention provides a technique for forming a CMOS structure including at least one pFET that has a stressed channel which avoids the problems mentioned in the prior art. That is, the present invention provides a method for avoiding the formation of deep canyons at the interface between the active area and the trench isolation region, without requiring a trench isolation pulldown, thereby eliminating the problems of silicide to source/drain shorts and contact issues. At the same time, the method of the present invention provides a structure that allows for a facet to form at the spacer edge, retaining the Miller capacitance benefit that such a structure provides. The inventive structure also results in higher uniaxial stress in the MOSFET channel compared to one which allows for a facet to grow at the trench isolation edge.

Specifically, and in broad terms, the semiconductor structure of the present invention comprises:

a semiconductor substrate including at least one trench isolation region embedded therein, said at least one trench isolation region comprises an inner trench dielectric, a nitride lining said inner trench dielectric and an oxide lining a portion of said nitride, wherein said oxide is not located at an upper surface of said inner trench dielectric and said nitride;

at least one gate region located on a surface of said semiconductor substrate, said at least one gate region including at least a gate dielectric, a gate conductor and an inner oxide spacer having a notched lower surface; and a stress inducing material embedded within said semiconductor substrate at a footprint of said at least one gate region, said stress inducing material has a faceted surface at the notched lower surface, but does not have a faceted surface at an edge of said at least one trench isolation region.

In some embodiments of the present invention, a silicide is formed atop the stress inducing material.

In addition to the semiconductor structure described above, the present invention also relates to a method of fabricating the same. Specifically, and in broad terms, the method of the present invention comprises:

providing a structure including at least one trench isolation region located within a semiconductor substrate, said at least one trench isolation region including an oxide liner in contact with said semiconductor substrate and lining walls of a trench located within said semiconductor substrate, a nitride liner on said oxide liner and a dielectric material on said nitride liner;

forming at least one gate region on said semiconductor substrate, said at least one gate region including at least an inner oxide spacer in contact with a gate conductor and a gate dielectric of said gate region;

recessing the semiconductor substrate adjacent to said at least one trench isolation and said at least one gate region, wherein said recessing forms a cavity in said semiconductor substrate that exposes a portion of the oxide liner of said at least one trench isolation region and a portion of said inner oxide spacer;

removing said exposed portion of the oxide liner, while forming a recess in said exposed portion of said inner oxide spacer; and filling said cavity with a stress inducing material, said stress inducing material is faceted at said inner oxide spacer, but not at an edge of the at least one trench isolation region.

In some embodiments of the present invention, a step of forming a silicide atop said stress inducing material, follows the filling of the cavity with a stress inducing material.

It is noted that the method of the present invention is particularly suitable for improving the stress and yield in pFETs.

DETAILED DESCRIPTION OF THE INVENTION

The present invention, which provides a structure and a method for improved stress and yield in a CMOS technology including at least one pFET, will be described in greater detail by referring to the following discussion, together with the drawings that accompany the present application. It is noted that the drawings of the present invention are provided for illustrative purposes and thus they are not drawn to scale.

Figure 4A:
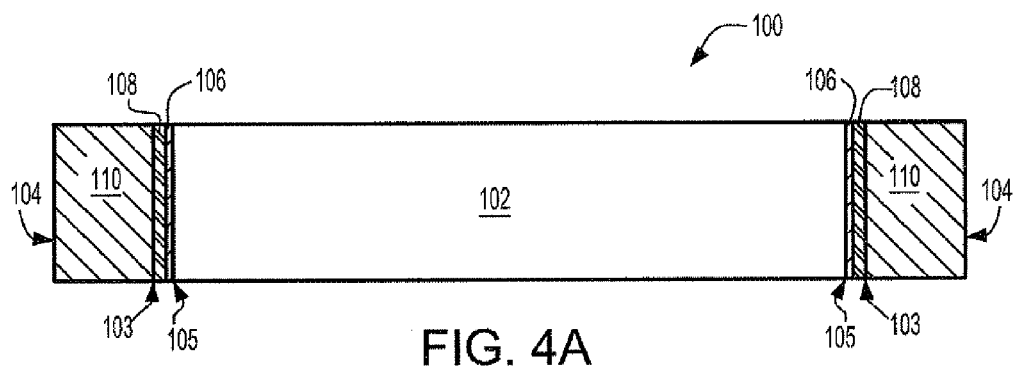
FIGS. 4A-4F show the basic processing steps (through cross sectional views) that are used in forming the semiconductor structure of the present invention.

Reference is first made to the initial structure 100 shown in FIG. 4A. Specifically, structure 100 includes a semiconductor substrate 102 that has at least one trench isolation region 104 embedded within the substrate. As shown, the at least one trench isolation region 104 comprises an oxide liner 106 which is in contact with the semiconductor substrate 102 and lining walls of a trench located within the semiconductor substrate 102. The at least one trench isolation region 104 also includes a nitride liner 108 on the oxide liner 106 and a trench dielectric material 110 on the nitride liner 108. Reference numeral 105 denotes the outermost edge of the trench isolation region 104, while reference numeral 103 denotes the edge of the trench dielectric 110.

The semiconductor substrate 102 of the initial structure 100 comprises any semiconducting material including, for example, Si, Ge, SiGe, SiC, SiGeC, Ge, GaAs, GaN, InAs, InP and all other III/V or II/VI compound semiconductors. Semiconductor substrate 12 may also comprise an organic semiconductor or a layered semiconductor such as Si/SiGe, a silicon-on-insulator (SOI), a SiGe-on-insulator (SGOI) or germanium-on-insulator (GOI).

In some embodiments of the present invention, it is preferred that the semiconductor substrate 102 be composed of a Si-containing semiconductor material, i.e., a semiconductor material that includes silicon. The semiconductor substrate 102 may be doped, undoped or contain doped and undoped regions therein. The semiconductor substrate 102 may include a single crystal orientation or it may include at least two coplanar surface regions that have different crystal orientations (the latter substrate is referred to in the art as a hybrid substrate). When a hybrid substrate is employed, the nFET is typically formed on a (100) crystal surface, while the pFET is typically formed on a (110) crystal plane. The hybrid substrate can be formed by techniques that are well known in the art.

The semiconductor substrate 102 may also include a first doped (n- or p-) region, and a second doped (n- or p-) region.

For clarity, the doped regions are not specifically shown in the drawing of the present application. The first doped region and the second doped region may be the same, or they may have different conductivities and/or doping concentrations. These doped regions are known as "wells" and they are formed utilizing conventional ion implantation processes.

The at least one trench isolation region 104 is then typically formed into the semiconductor substrate 102. The at least one trench isolation region 104 is formed by first providing a trench having walls 105 in the semiconductor substrate 102. A sacrificial material such as an oxide can be formed atop the substrate prior to forming the trench and after trench fill, the sacrificial material can be removed from the surface of the semiconductor substrate 102. The trench is formed by lithography which includes forming a photoresist on the surface of the substrate 102, exposing the photoresist to a desired pattern of radiation (i.e., a trench pattern) and developing the exposed photoresist utilizing a conventional developer. Negative-tone as well as positive tone-photoresists are contemplated herein.

After patterning the resist, the pattern is transferred into the semiconductor substrate by utilizing a conventional etching process. The present invention contemplates a dry etching process such as reactive-ion etching, ion beam etching, plasma etching, laser ablation, or a chemical wet etch process. Combinations of various etching techniques can also be used and are thus within the scope of the present invention. It is noted that the depth of the trench may vary depending upon a number of factors including, for instance, the exact etching technique and conditions used as well as the type of devices being isolated. For typical modern FETs, the trench has a depth, as measured from the upper surface of the semiconductor substrate to the trench bottom wall, of about 0.75 µm or less.

Next, the oxide liner 106 is formed on the exposed walls 105 of the trench. The oxide liner 106 is formed utilizing a conventional deposition process such as, for example, chemical vapor deposition (CVD), plasma-enhanced chemical vapor deposition, evaporation, chemical solution deposition and other like deposition processes that can provide conformal coverage of oxide on the exposed sidewalls. In a preferred embodiment of the present invention, the oxide liner 106 is formed by a conventional thermal oxidation process. Notwithstanding the technique used in forming the oxide liner 106, the oxide liner 106 typically has a thickness from about 2 to about 25 nm, with a thickness from about 5 to about 10 nm being even more typical.

After forming the oxide liner 106, the nitride liner 108 is formed thereon. Specifically, the nitride liner 108 is formed by a deposition process (including the same or different deposition technique as used in forming the oxide liner 106) or a thermal nitridation process can be employed. The nitride liner 108 includes nitride liners or oxynitride liners. The thickness of the nitride liner 108 may vary depending on the technique used, but generally it has a thickness that is greater than the thickness of the oxide liner 106. Typically, the nitride liner 108 has a thickness from about 10 to about 50 nm, with a thickness from about 15 to about 25 nm being even more typical.

The trench including liners 106 and 108 is then filled with a trench dielectric material such as, for example, an oxide. Optionally, a densification step may be performed after the trench fill and a planarization process may follow the trench fill as well.

Note that the at least one isolation region 104 provides isolation between neighboring gate regions, typically required when the neighboring gates have opposite conductivities, i.e., nFETs and pFETs.

Figure 4B:
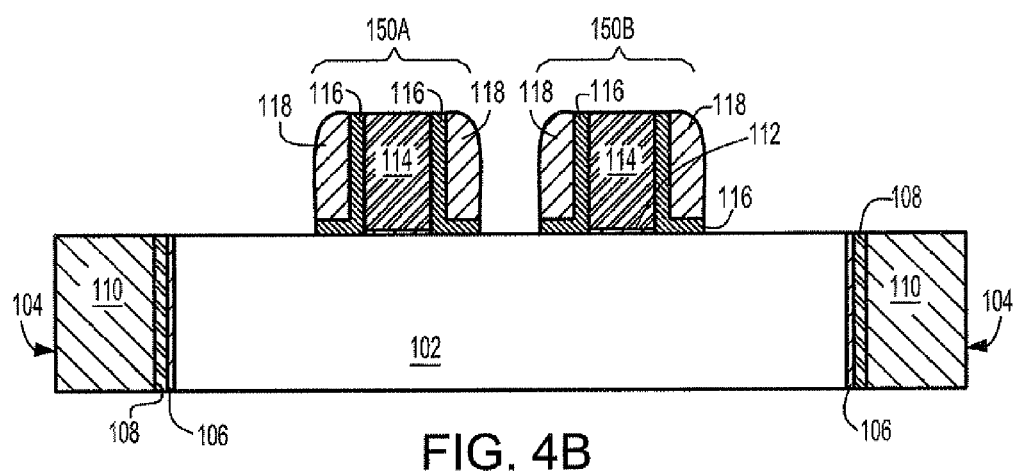

FIG. 4B shows the structure of FIG. 4A after at least one gate region is formed on the surface of the semiconductor substrate 102. The at least one gate region comprises a pFET and optionally an nFET that would be formed to the periphery of the device region illustrated in the drawings. pFETs are used in the present invention since they typically exhibit strain enhancement when embedded stress materials (to be described in greater detail herein below) are used. In the drawings, two gate regions 150A and 150B are shown to illustrate that a plurality of gate regions can be formed in any given active device region. Each of the gate regions (e.g., 150A and 150B) includes at least an inner oxide spacer 116 in contact with a gate conductor 114 and a gate dielectric 112. Each gate region may also include an optional outer spacer 118, if desired.

One method of forming the gate region includes first providing the gate dielectric 112 on the surfaces of both the semiconductor substrate 102 and the isolation regions 104. The gate dielectric 112 can be formed by a deposition process such as, for example, chemical vapor deposition (CVD), plasma-assisted CVD, metalorganic chemical vapor deposition (MOCVD), atomic layer deposition (ALD), evaporation, reactive sputtering, chemical solution deposition and other like deposition processes. The gate dielectric 112 may also be formed utilizing any combination of the above processes.

The gate dielectric 112 is comprised of an oxide, nitride, oxynitride or any combination thereof. Typically, the gate dielectric 112 is comprised of an oxide such as $SiO_2$, a metal oxide, or a mixed metal oxide. The metal oxides and mixed metal oxides may be referred to as a high k gate dielectric since those materials have a dielectric constant of greater than about 4.0, preferably greater than 7.0. The metal oxide or a mixed metal oxide dielectric may optionally include silicon or nitrogen. Some examples of high gate dielectrics that can be employed in the present invention include: $HfO_2$, $HfSiO_x$, $ZrO_2$, $ZrSiO_x$, $Al_2O_3$, $TiO_2$, $La_2O_3$, $SrTiO_3$, $LaAlO_3$, $CeO_2$, $Y_2O_3$ and multilayers thereof.

The physical thickness of the gate dielectric 112 may vary, but typically, the gate dielectric 112 has a thickness from about 0.5 to about 10 nm, with a thickness from about 0.5 to about 3 nm being more typical.

In some embodiments of the present invention (not shown herein), an interfacial layer comprising $SiO_2$, SiON, a non-Si oxide or a non-Si oxynitride having a thickness from about 0.1 to about 1.5 nm is formed on the surface of the substrate 102 prior to forming the gate dielectric 112. The optional interfacial layer is formed by one of the above mentioned techniques that were used in forming the gate dielectric i.e., CVD, PECVD, ALD and the like. Thermal oxidation or chemical oxidation may also be used.

After forming the gate dielectric 112, the gate conductor 114 is formed on the surface of the gate dielectric 112. The gate conductor 114 is formed utilizing a conventional deposition process including, for example, CVD, PECVD, plating, reactive sputtering, MOCVD, ALD, evaporation, chemical solution deposition and other like deposition processes. The thickness of the gate conductor 114 may vary depending on the technique used in forming the same as well as the material used in forming the electrode. Typically, the gate conductor 114 has a thickness from about 200 to about 50 nm, with a thickness from about 150 to about 75 nm being more typical.

The gate conductor 114 may comprise a Si-containing material (such as, for example, polySi, amorphous Si or Side), an elemental metal, an alloy (e.g., binary or ternary) of an elemental metal, a nitride of an elemental metal, a silicide of an elemental metal, a conductive oxide or any combination thereof. Examples of metal gate conductors include, but are not limited to: TiN, TaN, W, Co, Ni, Cu, Cr, Mo and other like materials that include a low resistivity metal (on the order of about 50 microOhm*cm or less).

In some embodiments (not shown), the gate region includes a stack of more than one of the above mentioned gate conductors. In embodiments wherein a stack of gate conductors are used, a diffusion barrier can be formed between each of the gate conductors. In yet another embodiment of the present (also not shown), a capping layer is formed atop the upper most conductive layer.

It is noted that when Si-containing materials are used as the gate conductor 114, the Si-containing material can be doped in-situ during the deposition process. Alternatively, doping of the Si-containing material can occur during formation of the source/drain regions.

Lithography and etching (as described above) are then performed to form patterned regions of the gate dielectric 112 and the gate conductor 114. Next, inner oxide spacer 116 are formed on the exposed surfaces of gate conductor 114, the gate dielectric 112 as well as a surface portion of semiconductor substrate 102 located at the footprint of the patterned gate stacks. The inner oxide spacer 116 is formed utilizing a conformal deposition process followed by anisotropic etching. Alternatively, the inner oxide spacer 116 is formed by a thermal oxidation process. The inner oxide spacer 116 is relatively thick such that after performing the semiconductor recess etch, oxide remains under the outer spacer 118, if present. In accordance with the present invention, the inner oxide spacer 116 has a thickness from about 3 to about 30 nm, with a thickness from about 5 to about 15 nm being even more typical.

As stated above, an optional outer spacer 118 can also be formed by deposition and etching. FIG. 4B shows the presence of the optional outer spacer 118 which typically is comprised of a nitride or an oxynitride material. The optional outer spacer 118 has a thickness from about 10 to about 75 nm, with a thickness from about 15 to about 35 nm being more typical.

In should be noted that the above describes one way of fabricating the gate regions shown in FIG. 4B. Another way of forming gate regions is by utilizing a replacement gate process (not shown). In such a process, a sacrificial material having a height approximately equal to or greater than the height of the gate stacks is deposited on the surface of the semiconductor substrate. Openings extending to the surface of the semiconductor substrate are then formed by lithography and etching. In this case, an oxide outer spacer is formed on the exposed walls of the sacrificial material, followed by the formation of an optional inner spacer, which might consist of low dielectric constant materials to further decrease the Miller capacitance of the FET structure. Next, the gate dielectric and gate conductor are formed and the sacrificial material is then removed utilizing an etch back process. In some embodiments of the present invention, the spacers are not formed until after the etch back step, with a resulting structure similar to that in FIG. 4B. It is noted that when the replacement gate process is used, the spacer structure shown in FIG. 4B is flipped horizontally such that the L-shaped oxide spacer is on the outside. The key is that at the time of epi growth, the edge of the recessed cavity nearest the channel has oxide exposed, while the edge nearest the trench isolation region has nitride exposed.

After spacer formation, source/drain diffusion regions (not labeled in the drawing, but see FIG. 4F) are then formed into the substrate 102. The source/drain diffusion regions are formed utilizing ion implantation and an annealing step. The annealing step serves to activate the dopants that were implanted by the previous implant step and to heal the damage to the silicon lattice created during ion implantation. The conditions for the ion implantation and annealing are well known to those skilled in the art. The source/drain diffusion regions may also include extension implant regions, which are formed prior to source/drain implantation using a conventional extension implant. The extension implant may be followed by an activation anneal, or alternatively the dopants implanted during the extension implant and the source/drain implant can be activated using the same activation anneal cycle. Halo implants are also contemplated herein.

Figure 4C:
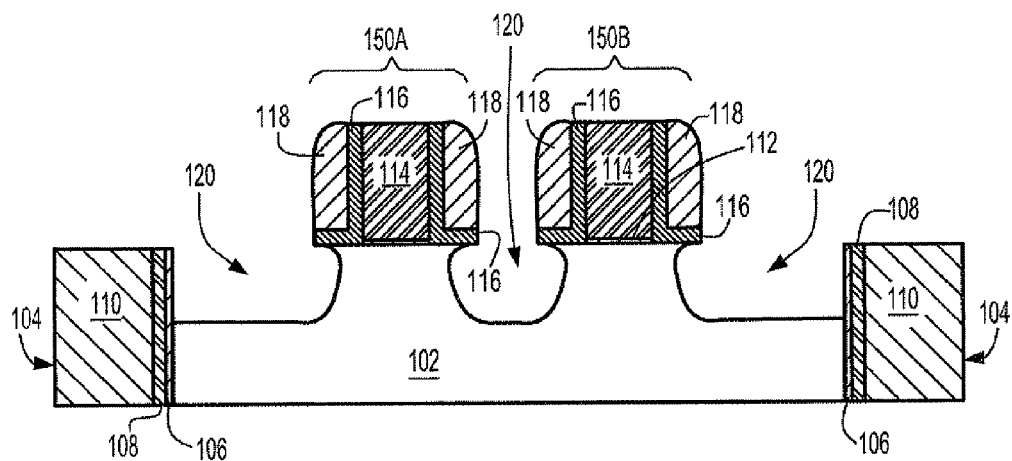

Cavities 120 are then formed in the semiconductor substrate 102 at the footprint of each of the gate regions. Specifically, the cavities 120 are formed in the device source and drain regions exposing the oxide liner 106 of the trench isolation region and a surface portion of the inner oxide spacer 116 that lies atop the horizontal surface of the semiconductor substrate 102. The structure including the cavities 120 is shown in FIG. 4C, for example. The cavities 120 are formed utilizing an etching technique that is selective in removing semiconductor material as compared with oxide and nitride. The cavity formation etch can be isotropic, anisotropic, or may consist of multiple etch processes. The isotropic etch forms a slight undercut beneath the spacers. For example, RIE or wet etching can be used in forming the cavities 120 into a silicon substrate 102. It is noted that the depth of the cavities is generally less than the depth of the trench isolation regions 104.

Figure 4D:
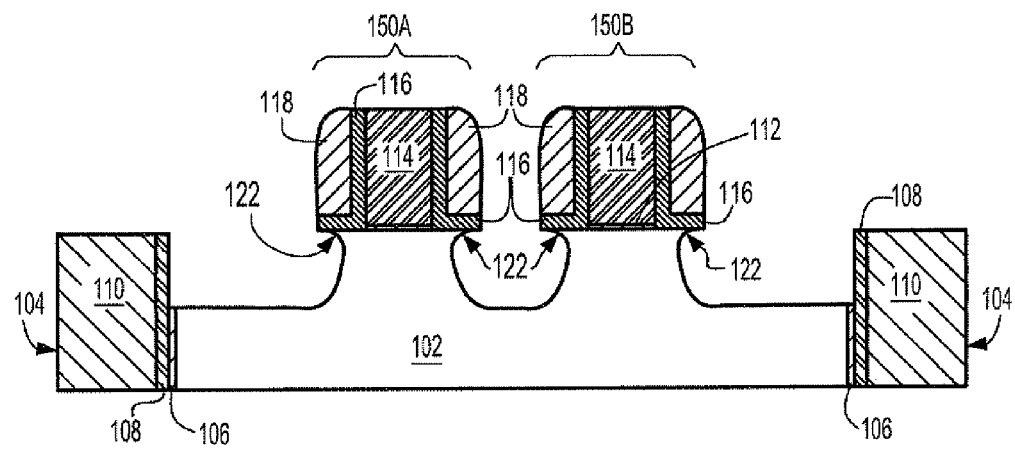

At this point of the present invention, an etching process that selectively removes oxide is performed to ensure that the nitride liner 108 of the trench isolation region 104 is exposed. Note that during this etch some of the oxide spacer 116 is removed providing a notch or recess 122 in the oxide spacer 116. The etching process used in this step of the present invention typically includes wet etchants such as dilute buffered hydrofluoric acid. Other etching techniques that selectively remove oxide are also contemplated herein. The structure that is formed after this selective oxide etching step has been performed is shown, for example, in FIG. 4D.

Following the selective oxide etch process which removes exposed oxide liner 106 within the cavities, the etched surfaces are cleaned utilizing any cleaning process that can remove contaminates. A selective epitaxial growth process (Rapid Thermal Chemical Vapor Deposition or Ultra High Vacuum Chemical Vapor Deposition) can than be used to fill the cavities with a stress inducing material. The stress inducing material includes any semiconductor material including SiC or SiGeC that has a different lattice constant than the original semiconductor substrate 102. The stress inducing materials generate a stress in the device channel of each device. In embodiments in which RTCVD is used and SiGe or SiC are used as the stress inducing material, the following conditions are typically used: deposition temperature of about 500° C. to about 1000° C., pressure from about 5 to about 100 Torr, and a precursor comprising a Si source such as a silane, a disilane, or a dichlorosilane, a Ge source such as $GeH_4$ or a C source such as an alkene. Note that the epitaxy forms raised regions including, the stress inducing material.

Figure 4E:
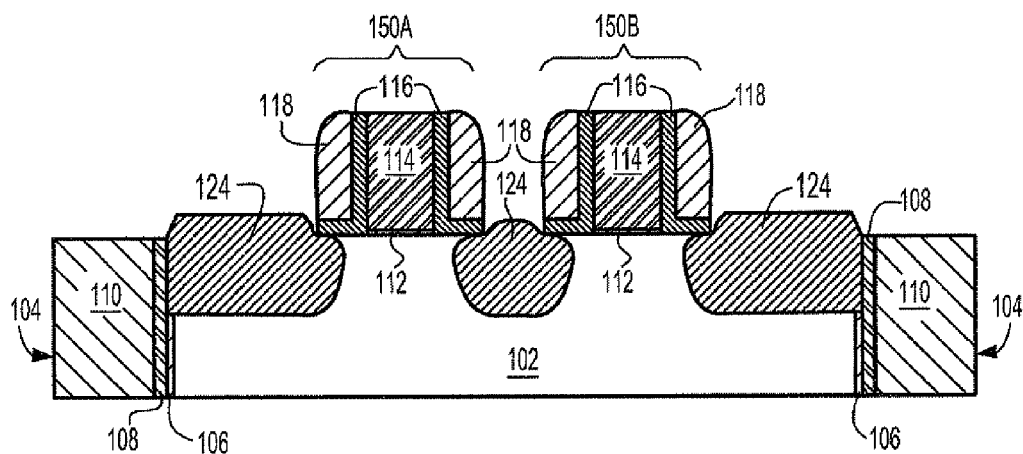

The structure including the embedded stress inducing material is shown, for example, in FIG. 4E. In this drawing, reference numeral 124 denotes the stress inducing material that is formed into the cavities 120. As shown, some of the stress inducing material 124 may be formed above the surface of the semiconductor substrate forming raised regions.

Figure 4F:
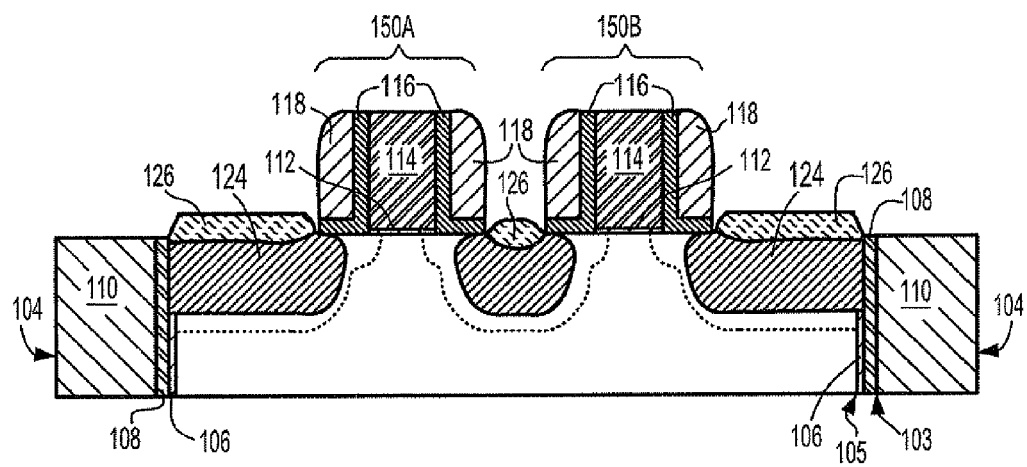

FIG. 4F illustrates the structure that is formed after silicide 126 formation. As shown, the silicide 126 is formed on the exposed portions of the embedded stress inducing material 124. Silicide may also form atop the gate conductor, if the gate conductor is comprised of a Si-containing material. The silicide 126 is formed by first forming a metal layer such as nickel (Ni), cobalt (Co), titanium (Ti), tungsten (W) or other like metal that is capable of forming a silicide when reacted with silicon on the structure shown in FIG. 4E The metal deposition is typically carried out by sputtering, evaporation, chemical vapor deposition or a similar blanket deposition process. The layer of metal is reacted with the exposed stress inducing material 124 to form a silicide contact 126. The silicide formation includes the uses of a conventional self-aligned silicidation (SALICIDE) process.

With this process, the silicide forms only over exposed regions including silicon. The exact conditions of the anneal used during the self-aligned silicidation process may vary depending on the type of metal. A single anneal step may be used, followed by etching of any unreacted metal. Alternatively, the silicide contact can be formed by a first anneal, etching and a second anneal, wherein the temperature of the first anneal is typically lower than the temperature of the second annealing. In cases where a non Si-containing stress inducing material is formed, a Si layer is typically formed prior to metal layer deposition. Alternatively, a metal-semiconductor alloy can be formed, if it has low resistance.

Figure 1:
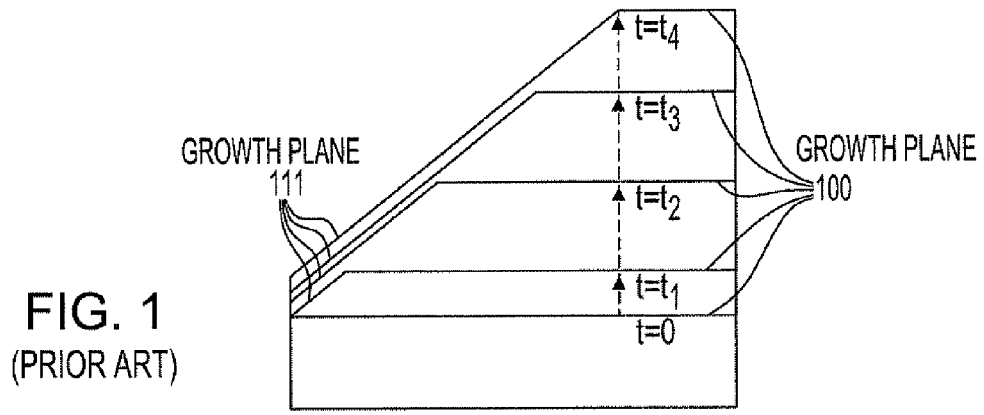
FIG. 1 is a pictorial representation illustrating facet formation during SiGe epitaxy.
Figure 2:
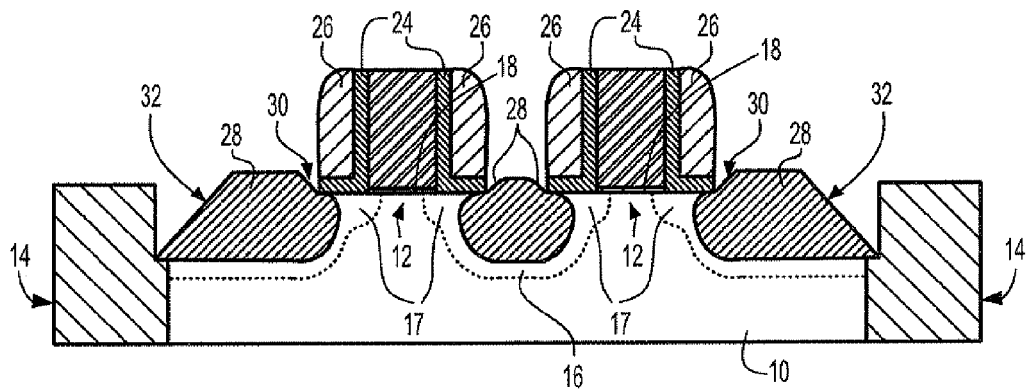
FIG. 2 is a pictorial representation (through a cross sectional view) illustrating a prior art structure showing the faceting at STI regions.
Figure 3:
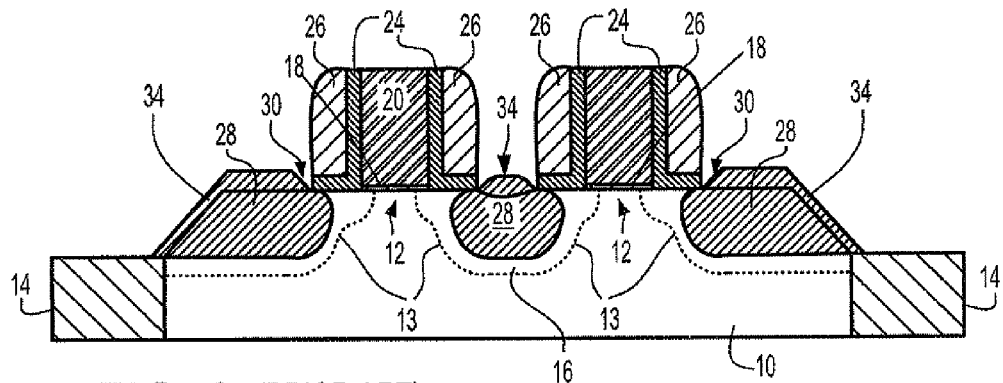
FIG. 3 is a pictorial representation (through a cross sectional view) illustrating a prior art structure including pulldown STI regions.

Specifically, FIG. 4F shows the structure of the present invention, which differs from the prior art structures shown in FIGS. 1 and 2, by obtaining a raised source and drain structure which is faceted at the inner oxide spacer 116 sidewall, but not at the trench isolation 105 edge. Hence, the reduced Miller capacitance due to sidewall facet is retained, while the loss of stress and yield implications accompanying the faceted growth at the trench isolation edge are avoided entirely. It is noted that this drawings includes source/drain diffusion regions 128 and junction 130.

The structure shown in FIG. 4F is made possible by modifying the trench isolation regions 104 in such a way that at the time of forming the stress inducing material within the cavities, a portion of the nitride liner 108 of the trench isolation regions 104 is exposed. At the same time, a bottom oxide surface of the inner oxide spacer 116 is exposed. Because there are now two dissimilar materials present on the sidewalls (spacer and trench isolation region) one can obtain the desired faceted growth at the spacer edge, and simultaneously obtain unfaceted growth along the STI edges.

In some embodiments of the present invention, a stress inducing liner such as an oxide or nitride is formed about the at least one gate region utilizing deposition and etching.

While the present invention has been particularly shown and described with respect to preferred embodiments thereof, it will be understood by those skilled in the art that the foregoing and other changes in forms and details may be made without departing from the scope and spirit of the present invention. It is therefore intended that the present invention not be limited to the exact forms and details described and illustrated, but fall within the scope of the appended claims.

What is claimed is:

1. A method of forming a semiconductor structure comprising:
   providing a structure including at least one trench isolation region located within a semiconductor substrate, said at least one trench isolation region including an oxide liner in contact with said semiconductor substrate and lining walls of a trench located within said semiconductor substrate, a nitride liner on said oxide liner and a dielectric material on said nitride liner;
   forming at least one gate region on said semiconductor substrate, said at least one gate region including at least an inner oxide spacer in contact with a gate conductor and a gate dielectric of said gate region;
   recessing the semiconductor substrate adjacent to said at least one trench isolation and said at least one gate region, wherein said recessing forms a cavity in said semiconductor substrate that exposes a portion of the oxide liner of said at least one trench isolation region and a portion of said inner oxide spacer;
   removing said exposed portion of the oxide liner, while forming a recess in said exposed portion of said inner oxide spacer; and
   filling said cavity with a stress inducing material, said stress inducing material is faceted at said inner oxide spacer, but not at an edge of the at least one trench isolation region.

2. The method of claim 1 further comprising forming a silicide atop said stress inducing material.

3. The method of claim 1 wherein said at least one trench isolation region is formed by lithography, etching, providing said oxide liner, providing said nitride liner and providing said trench dielectric.

4. The method of claim 1 wherein said recessing is performed utilizing an isotropic etching technique.

5. The method of claim 1 wherein said cavity has a depth that is less than a depth of the at least one trench isolation region.

6. The method of claim 1 wherein said removing said oxide liner comprises a selective oxide etching technique.

7. The method of claim 1 wherein said filling said cavity comprises a selective epitaxial growth technique.

8. The method of claim 1 wherein said stress inducing material comprises an alloy of Si and Ge, and optionally C.

9. The method of claim 1 wherein said forming said at least one gate region comprises providing at least a pFET.

* * * * *